United States Patent
Yun et al.

(10) Patent No.: US 7,096,547 B2
(45) Date of Patent: Aug. 29, 2006

(54) MANUFACTURING METHOD OF CERAMIC DEVICE USING MIXTURE WITH PHOTOSENSITIVE RESIN

(75) Inventors: Sang Kyeong Yun, Suwon-Shi (KR); Dong Hoon Kim, Suwon-Shi (KR); Sung June Park, Suwon-Shi (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 397 days.

(21) Appl. No.: 10/688,281

(22) Filed: Oct. 17, 2003

(65) Prior Publication Data

US 2004/0055128 A1    Mar. 25, 2004

Related U.S. Application Data

(62) Division of application No. 09/444,128, filed on Nov. 19, 1999, now Pat. No. 6,662,418.

(30) Foreign Application Priority Data

Jul. 13, 1999    (KR) ............................. 1999-28240

(51) Int. Cl.
*H04R 17/00* (2006.01)
*H01L 41/083* (2006.01)
*G03C 5/00* (2006.01)

(52) U.S. Cl. .................. 29/25.35; 29/847; 29/DIG. 16; 430/317; 430/318; 216/27; 216/41; 310/364; 310/366

(58) Field of Classification Search .............. 29/25.35, 29/846, 847, 851, DIG. 16; 430/311, 313, 430/317, 318, 324; 156/275.5; 216/27, 216/41, 48; 310/311, 363, 364, 366
See application file for complete search history.

(56) References Cited

U.S. PATENT DOCUMENTS

| 5,248,912 | A | * | 9/1993 | Zdeblick et al. ........ 310/366 X |
| 5,265,315 | A | | 11/1993 | Hoisington et al. |
| 6,334,244 | B1 | * | 1/2002 | Hashizume ................ 29/25.35 |

FOREIGN PATENT DOCUMENTS

JP        62-137856    *    6/1987    ............. 430/324 X

OTHER PUBLICATIONS

Kline-Schoder et al., "Physical Vapor Deposition of Multilayer Lead-Zirconate-Titanate Films for Ultrasonic Transducer Fabricatioin", 1997 IEEE Ultrasonics Symposium, vol. 2, Oct 1997, pp. 937-942.*

* cited by examiner

*Primary Examiner*—A. Dexter Tugbang
(74) *Attorney, Agent, or Firm*—Darby & Darby

(57) ABSTRACT

A manufacturing method for a ceramic device using a mixture with a photosensitive resin includes: providing a ceramic substrate, forming a lower electrode on the substrate using a mixture of a photosensitive resin and metal, masking and exposing the lower electrode to pattern the lower electrode, forming a piezoelectric/electrostrictive layer on the lower electrode using a mixture of photosensitive resin and piezoelectric/electrostrictive ceramic, masking and exposing the piezoelectric/electrostrictive layer to pattern the piezoelectric/electrostrictive layer, forming an upper electrode on the piezoelectric/electrostrictive layer using the mixture of photosensitive resin and metal, and exposing the upper electrode to pattern the upper electrode.

5 Claims, 3 Drawing Sheets

MANUFACTURING METHOD OF CERAMIC DEVICE USING MIXTURE WITH PHOTOSENSITIVE RESIN

This is a Divisional application of 09/444,128, filed on Nov. 19, 1999, now U.S. Pat. No. 6,662,418. Each of these prior applications is hereby incorporated herein by reference, in its entirety.

BACKGROUND OF THE INVENTION

1. Field of the Invention

The present invention relates a manufacturing method of ceramic device. In particular, the invention relates a manufacturing method of ceramic device by light exposure process using a mixture with photosensitive resin.

2. Description of the Prior Art

In order to manufacture a ceramic device, heretofore a method has been used to form a piezoelectric/electrostrictive layer on a substrate, or on a lower electrode formed on a substrate, after which the piezoelectric/electrostrictive layer is patterned into desired pattern, on which patterned layer an upper electrode is formed.

Photosensitive film is often used to patterning the piezoelectric/electrostrictive layer in manufacturing method as above.

Micro patterning using a photosensitive film is a shape control method having submicron level precision as it has resolution degree corresponding to ultraviolet ray wavelength, which method chemically removes needless part using the material property change according to whether or not of light exposure.

Portion remaining after partly removal by light exposure is usually used as mask or mold in next process.

But ceramic device used in electronic appliances is also being miniaturized and highly integrated as electronic appliances themselves are gradually miniaturized.

There is need of application of new molding method differentiated from conventional molding method for integration and miniaturization of ceramic device and particularly there arose essential need of making the device shape highly precise along with device miniaturization.

SUMMARY OF THE INVENTION

The present invention to solve the above problem aims to provide a manufacturing method of ceramic device simple in its process and very high degree of precision in structure by patterning a device of desired shape having a multilayer structure only by light exposure process using a mixture of photosensitive resin with metal or ceramic.

The invention to achieve the aim features a manufacturing method of ceramic device either comprising the steps of forming by layer accumulation of a lower electrode, a piezoelectric/electrostrictive layer, and an upper electrode on a substrate using a mixture of photosensitive resin and metal or piezoelectric/electrostrictive ceramic; and patterning by light exposure at a single time, or repeating the step of patterning by light exposure after formation for layer by layer.

And the invention features a manufacturing method of ceramic device either comprising the steps of forming by layer accumulation of a piezoelectric/electrostrictive layer and an upper electrode on a metal substrate using a mixture of photosensitive resin and metal or piezoelectric/electrostrictive ceramic; and patterning by light exposure at a single time, or repeating the step of patterning by light exposure after formation for layer by layer.

DETAILED DESCRIPTION

Figure 1:
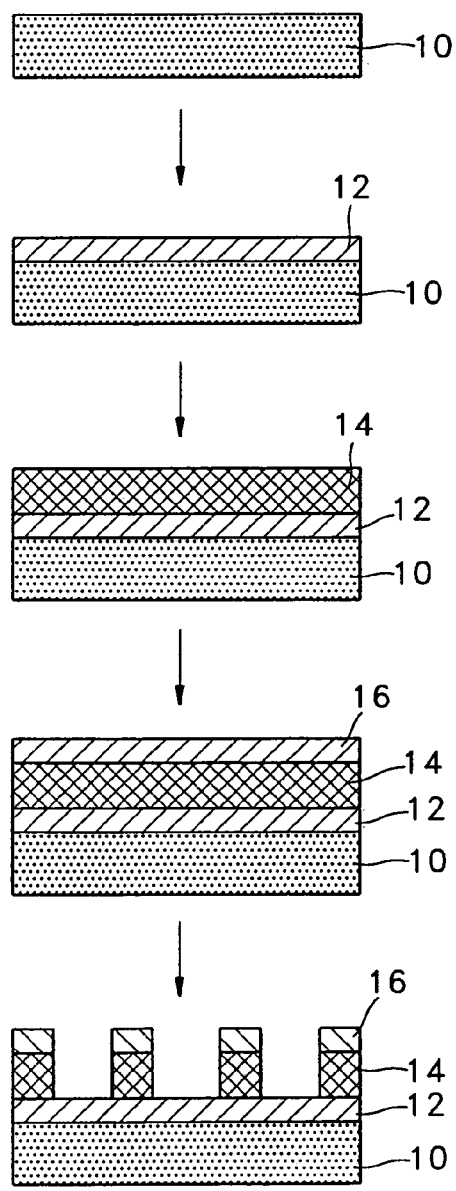
FIG. 1 is a process diagram roughly showing an example of the present invention.

The present invention is explained in detail as follows.

A manufacturing method of a ceramic device using a mixture with photosensitive resin can be largely classified into a manufacturing method for a ceramic device by sequentially forming respective layers and then patterning them altogether at a time by light exposure and another manufacturing method for a ceramic device by repeating the step of patterning by light exposure after layer formation for layer by layer.

Firstly, the manufacturing method for a ceramic device according to the present invention is explained, in which respective layers are formed sequentially and then the layers are patterned altogether at a time by light exposure.

Metal or ceramic may be used for a substrate. As for the metal for the substrate, it is preferable to use nickel or stainless steel. As for ceramics, it is preferable to use aluminum oxide ($Al_2O_3$), zirconium oxide ($ZrO_2$), silicon (Si), silicon carbide (SiC), silicon nitride ($Si_3N_4$), silicon dioxide ($SiO_2$), or glass.

There is no need to form a separate lower electrode if the metal is used for the substrate because metal itself is conductive while a lower electrode layer must be formed on the substrate if the ceramic is used for the substrate.

Metal without photosensitive resin is used for a lower electrode if the lower electrode is to be used as it is not patterned while a mixture of photosensitive resin and metal is used for a lower electrode if the lower electrode also is to be patterned.

As for photosensitive resin to form a mixture with metal, it is preferable to use a conductive UV adhesive or a transformed material transformed from organic compound making a chelate with metal.

A molded lower electrode is thermally treated or hardened by natural drying or heat treatment to form a lower electrode.

A piezoelectric/electrostrictive layer is molded on lower electrode layer using a mixture of photosensitive resin and piezoelectric/electrostrictive ceramic.

As for the mixture of photosensitive resin and piezoelectric/electrostrictive ceramic, it is preferable to use a ceramic sol solution containing photosensitive complexing agent, a mixture of ultraviolet ray hardening resin and ceramic powder, a mixture of said mixture of ultraviolet ray hardening resin and ceramic powder and a ceramic sol solution of same or similar composition with said ceramic powder, or a mixture prepared by additional mixing of an organic solvent for controlling the material property into said mixture of ultraviolet ray hardening resin and ceramic powder and a ceramic sol solution of same or similar composition with said ceramic powder.

Viscosity control agent, binder etc. are used for an organic solvent to control the material properties of the mixture of ultraviolet ray hardening resin, ceramic powder, and ceramic sol solution of same or similar composition with the ceramic powder.

Particularly dispersibility and viscosity of mixture and surface characteristics of ceramic powder can be controlled if ceramic sol solution is mixed with ceramic powder.

What is most important in mixing photosensitive resin and piezoelectric/electrostrictive ceramic material is to make a homogeneous mixture from these two and to bestow suitable viscosity for molding.

Adequate mixing ratio of piezoelectric/electrostrictive ceramic material and photosensitive resin should be defined to prepare homogeneous mixture and bestow suitable viscosity for molding.

The mixing ratio of these two cannot be determined in a single way because photosensitive resin itself may have diverse viscosities, and the quantity of piezoelectric/electrostrictive ceramic material mixed should be adjusted considering photosensitive resin viscosity for better microstructure and mechanical/electrical characteristics after hardening.

It is idealistic to select the ratio that would maintain wholesome structure and strength after hardening by effectively filling up voids between piezoelectric/electrostrictive ceramic material particles within range that photosensitive resin does not interrupt linkage among piezoelectric/electrostrictive ceramic material.

Whence the piezoelectric/electrostrictive layer is molded to a film by direct applying of piezoelectric/electrostrictive ceramic paste mixed with photosensitive resin by way of printing, coating etc. on lower electrode. The piezoelectric/electrostrictive layer is allowed to natural drying or thermally treated to be hardened.

Piezoelectric/electrostrictive layer may also be formed by separately molding into a film shape the piezoelectric/electrostrictive ceramic paste mixed with photosensitive resin, hardening it, and then laminating it on an upper electrode.

An upper electrode is formed on the formed piezoelectric/electrostrictive layer using the mixture of photosensitive resin and metal.

At this time also for photosensitive resin to mix with metal, it is preferable to use a conductive UV adhesive or a transformed material transformed from organic compound making a chelate with metal.

The upper electrode is allowed to natural drying or thermally treated to be hardened.

The upper electrode formed as above is masked to desired pattern so that necessary portion might not be removed. For masking method at this time, it is preferable to use shadow mask or photoresist.

The upper electrode layer is masked and the exposed portion in the upper electrode and the piezoelectric/electrostrictive layer is removed by being exposed to light, thus a ceramic device is completed. The lower electrode would also be patterned if a mixture of photosensitive resin and metal were used for lower electrode while the lower electrode will remain but not be removed if metal only was used for the lower electrode.

The ceramic device manufactured by the method may be used as it is but it may also be used after it is thermally treated and burnt of organic compound remaining in the lower electrode, the piezoelectric/electrostrictive layer and the upper electrode. It is preferable to thermally treat it at 200–500° C. in case the metal is used as the substrate because it is difficult to thermally treat it at high temperature according to the metal characteristics while it is preferable to thermally treat it at 500–1200° C. in case the ceramic is used as the substrate.

Now then another manufacturing method for ceramic device according to the present invention is explained, in which each layer is formed and patterned in order.

In the method, there is also no need to form a separate lower electrode if metal is used for a substrate while a lower electrode layer shall be formed on the substrate if ceramic is used for the substrate.

Metal without photosensitive resin is used for a lower electrode if the lower electrode is to be used as it is not patterned while a mixture of photosensitive resin and metal is used for the lower electrode if the lower electrode also is to be patterned.

The lower electrode shall be masked and exposed to light as described before in order to remove needless portion in case the mixture of photosensitive resin and metal is used for lower electrode among the above two cases.

The lower electrode is thermally treated or hardened by natural drying or heat treatment.

A piezoelectric/electrostrictive layer is molded on the lower electrode layer using a mixture of piezoelectric/electrostrictive ceramic containing the photosensitive resin. The piezoelectric/electrostrictive layer is allowed to natural drying or thermally treated to be hardened.

As for the mixture of photosensitive resin and piezoelectric/electrostrictive ceramic, materials of the former method case are used.

In the method, the piezoelectric/electrostrictive layer is molded to a film by direct applying of piezoelectric/electrostrictive ceramic paste mixed with photosensitive resin by way of printing, coating etc. on the lower electrode. The piezoelectric/electrostrictive layer is allowed to natural drying or thermally treated to be hardened.

The piezoelectric/electrostrictive layer may also be formed by separately molding into a film shape the piezoelectric/electrostrictive ceramic paste mixed with photosensitive resin, hardening it, and then laminating it on an upper electrode.

The piezoelectric/electrostrictive layer formed shall be masked and exposed in order to remove needless portion and complete the ceramic device.

The ceramic device manufactured by the method may be used as it is but it may also be used after it is thermally treated and burnt of organic compound remaining in the lower electrode, the piezoelectric/electrostrictive layer and the upper electrode. It is preferable to thermally treat it at 200–500° C. in case metal is used as the substrate because it is difficult to thermally treat it at high temperature according to metal characteristics while it is preferable to thermally treat it at 500–1200° C. in case ceramic is used as the substrate.

In accordance with present invention method as described above, ceramic device of high shape ratio can be produced without using traditional processes of high difficulty, and productivity in yield percentage, lead time etc. is also excellent.

And precision degree is very high because light is used for the patterning source so that arrangement between layers or with infrastructure is very precise; and other effect is also made to systematically prevent the short between upper and lower electrodes.

The present invention is explained more in detail as follows referring to drawings.

FIG. 1 shows a manufacturing method for a ceramic device by sequentially forming respective layers and then patterning them altogether at a time by light exposure.

Firstly a lower electrode 12 is formed with metal without photosensitive resin on a substrate 10. A piezoelectric/electrostrictive layer 14 is formed using the mixture of photosensitive resin and ceramic on the lower electrode 12.

An upper electrode 16 is formed using the mixture of photosensitive resin and metal on the piezoelectric/electrostrictive layer 14.

The upper electrode 16 is masked into desired pattern and exposed to light. A ceramic device is completed as the upper electrode 16 and the piezoelectric/electrostrictive layer 14 containing photosensitive resin are patterned into desired pattern by exposure.

Figure 2:
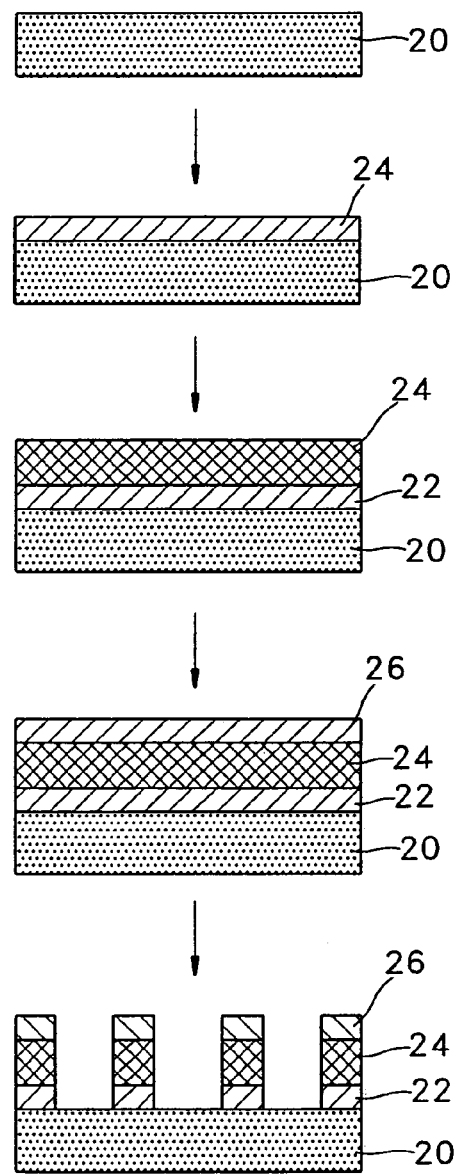
FIG. 2 is a process diagram roughly showing another example of the present invention.

FIG. 2 shows another manufacturing method for a ceramic device by sequentially forming respective layers and then patterning them altogether at a time by light exposure.

A lower electrode 22 is formed using a mixture of photosensitive resin and metal on a substrate 20. A piezoelectric/electrostrictive layer 24 is formed using a mixture of photosensitive resin and ceramic on the lower electrode 22.

An upper electrode 26 is formed using the mixture of photosensitive resin and metal on the piezoelectric/electrostrictive layer 24.

The upper electrode 26 is masked into desired pattern and exposed to light. A ceramic device is completed as the upper electrode 26, the piezoelectric/electrostrictive layer 24 and the lower electrode 22 containing photosensitive resin are patterned into desired pattern by exposure.

Figure 3:
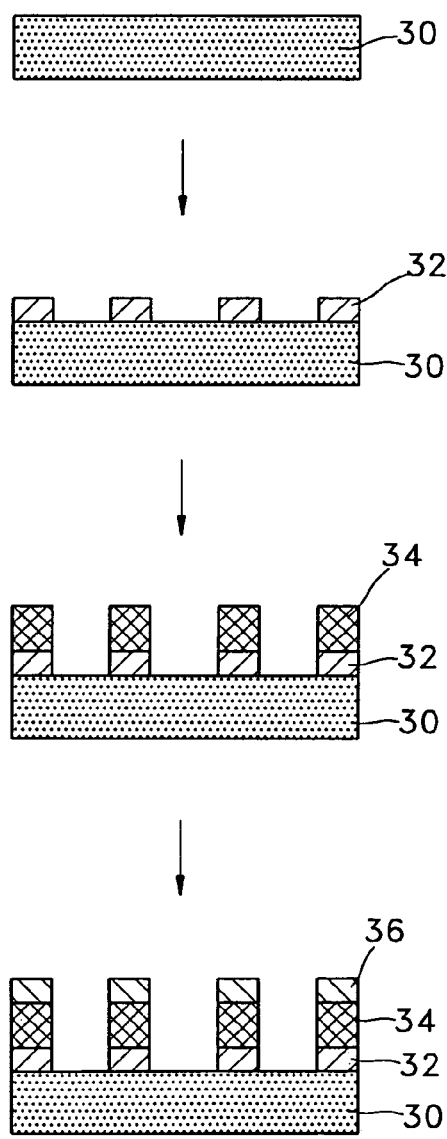
FIG. 3 is a process diagram roughly showing another example of the present invention.

FIG. 3 shows another manufacturing method for a ceramic device by repeating the step of patterning by light exposure after layer formation for layer by layer.

A lower electrode 32 is formed using a mixture of photosensitive resin and metal on a substrate 30. Then the electrode is masked and exposed to be patterned.

A piezoelectric/electrostrictive layer 34 is formed using a mixture of photosensitive resin and ceramic on the lower electrode 32. Then the layer 34 is masked and exposed to be patterned.

An upper electrode 36 is formed using the mixture of photosensitive resin and metal on the piezoelectric/electrostrictive layer 34. Then the electrode 36 is masked and exposed to be patterned so as to complete the ceramic device.

Figure 4:
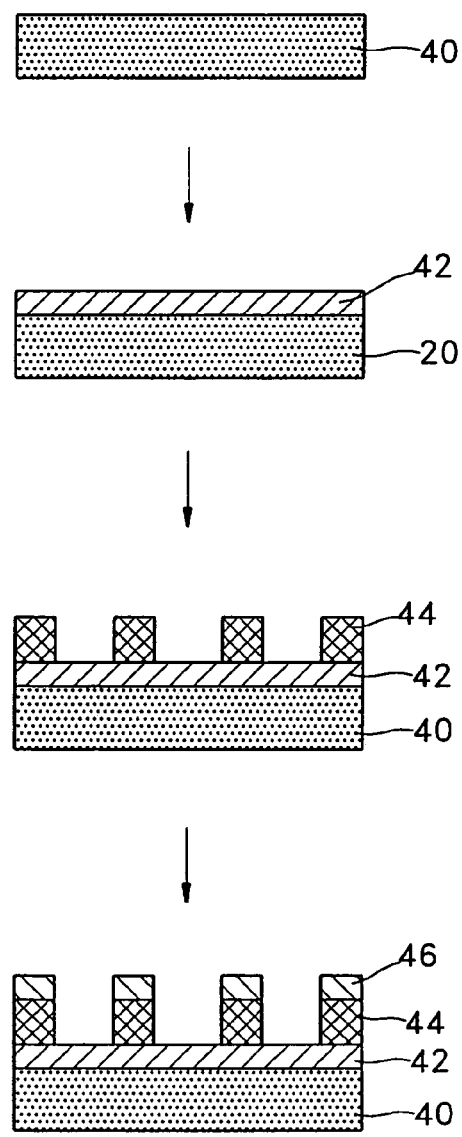
FIG. 4 is a process diagram roughly showing another example of the present invention.

FIG. 4 shows another manufacturing method for a ceramic device by repeating step of patterning by light exposure after layer formation for layer by layer.

A lower electrode 42 is formed with metal without photosensitive resin on a substrate 40.

A piezoelectric/electrostrictive layer 44 is formed using a mixture of photosensitive resin and ceramic on the lower electrode 42. Then the layer 44 is masked and exposed to be patterned.

An upper electrode 46 is formed using the mixture of photosensitive resin and metal on the piezoelectric/electrostrictive layer 44. Then the upper electrode 46 is masked and exposed to be patterned so as to complete the ceramic device.

Figure 5:
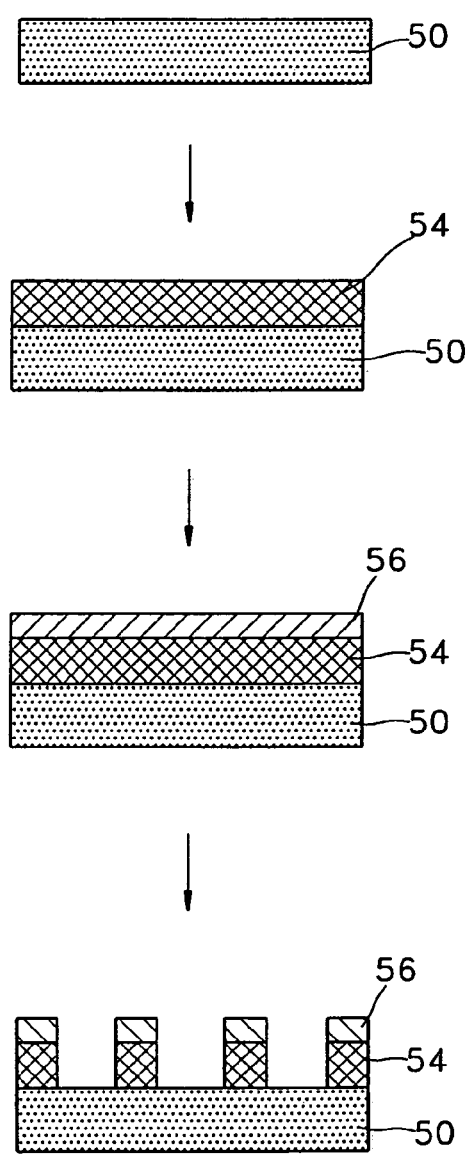
FIG. 5 is a process diagram roughly showing another example of the present invention.

FIG. 5 shows another manufacturing method for a ceramic device by sequentially forming respective layers and then patterning them altogether at a time by light exposure.

A piezoelectric/electrostrictive layer 54 is formed using a mixture of photosensitive resin and ceramic on a substrate 50.

An upper electrode 56 is formed using the mixture of photosensitive resin and metal on the piezoelectric/electrostrictive layer 54.

The upper electrode 56 is masked into desired pattern and exposed to light. The ceramic device is completed as the upper electrode 56 and the piezoelectric/electrostrictive layer 54 containing photosensitive resin are patterned into desired pattern by exposure.

Figure 6:
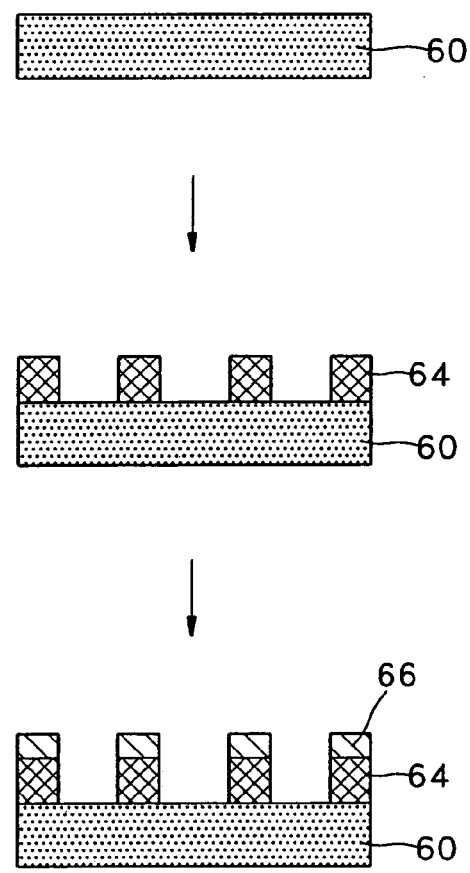
FIG. 6 is a process diagram roughly showing another example of the present invention.

FIG. 6 shows another manufacturing method for a ceramic device by repeating the step of patterning by light exposure after layer formation for layer by layer.

A piezoelectric/electrostrictive layer 64 is formed using a mixture of photosensitive resin and ceramic on a metal substrate 60. Then the piezoelectric/electrostrictive layer 64 is masked and exposed to be patterned.

An upper electrode 66 is formed using the mixture of photosensitive resin and metal on the piezoelectric/electrostrictive layer 64. Then the upper electrode 66 is masked and exposed to be patterned so as to complete the ceramic device.

The present invention is explained once more in detail as follows through examples. But the following application examples are only illustrations of the invention and do not confine extent of the invention.

EXAMPLE 1

A lower electrode was formed by screen printing of silver bond on a silicon substrate and then by thermally treating it.

A piezoelectric/electrostrictive ceramic complex material manufactured by mixing piezoelectric/electrostrictive fine powder of PZT-PMN series below 0.5 μm in particle diameter prepared by nonexplosive oxidative/reductive combustion reaction, glycolic PZT sol, ultraviolet ray hardening resin and viscosity control agent in weight ratio of 7:1:1:1 was coated on whole surface of the lower electrode.

As for the viscosity control agent, α-terpineol solution of ethyl cellulose was used.

An upper electrode was formed by coating an ultraviolet ray hardening silver bond on whole surface of dried piezoelectric/electrostrictive ceramic complex substance layer and then dried.

Finely patterned stainless steel mask was attached on it and ultraviolet ray was irradiated to harden the exposed portion, after which the unhardened portion was washed by solvent to produce finely patterned ceramic device.

EXAMPLE 2

A lower electrode was molded by screen printing of silver bond on a silicon substrate and then by thermally treating it.

A piezoelectric/electrostrictive ceramic complex material manufactured by mixing piezoelectric/electrostrictive fine powder of PZT-PMN series below 0.5 μm in particle diameter prepared by nonexplosive oxidative/reductive combustion reaction, glycolic PZT sol, ultraviolet ray hardening resin and viscosity control agent in weight ratio of 7:1:1:1 was coated on whole surface of the lower electrode.

Whence triethylene glycol was used for the viscosity control agent.

An upper electrode was formed by coating an ultraviolet ray hardening silver bond on whole surface of dried piezoelectric/electrostrictive ceramic complex substance layer and then dried.

Finely patterned stainless steel mask was attached on it and ultraviolet ray was irradiated to harden the exposed portion, after which the unhardened portion was washed by solvent to produce finely patterned ceramic device.

A ceramic device manufactured as above was thermally treated 800° C. to burn off organic compounds contained in the piezoelectric/electrostrictive layer and the upper electrode.

EXAMPLE 3

Ultraviolet ray hardening silver bond was coated by screen printing on whole surface of aluminum oxide substrate and was dried to form a lower electrode.

A piezoelectric/electrostrictive fine powder below 0.1 μm in particle diameter prepared by nonexplosive oxidative/reductive combustion reaction, glycolic PZT sol and ultraviolet ray hardening resin were mixed in weight ratio 7:1:2 whose mixture was coated on whole surface of the lower electrode to form a piezoelectric/electrostrictive layer.

An upper electrode was formed by coating an ultraviolet ray hardening silver bond by way of screen printing on whole surface of the piezoelectric/electrostrictive layer.

Finely patterned stainless steel mask was attached on it and ultraviolet ray was irradiated to harden the exposed portion, after which the unhardened portion was washed by solvent to produce finely patterned ceramic device.

EXAMPLE 4

Ultraviolet ray hardening silver bond was coated by screen printing on whole surface of aluminum oxide substrate and was dried to form a lower electrode.

A piezoelectric/electrostrictive fine powder below 0.1 μm in particle diameter prepared by nonexplosive oxidative/reductive combustion reaction, glycolic PZT sol and ultraviolet ray hardening resin were mixed in weight ratio 7:1:2 whose mixture was coated on whole surface of lower electrode to form a piezoelectric/electrostrictive layer.

An upper electrode was formed by coating an ultraviolet ray hardening silver bond by way of screen printing on whole surface of formed the piezoelectric/electrostrictive layer.

Finely patterned stainless steel mask was attached on it and ultraviolet ray was irradiated to harden the exposed portion, after which the unhardened portion was washed by solvent to produce finely patterned ceramic device.

A ceramic device manufactured as above was thermally treated 1,000° C. to burn off organic compounds contained in the piezoelectric/electrostrictive layer and the upper electrode.

EXAMPLE 5

Screen printing of ultraviolet ray hardening silver bond was carried out on silicon substrate, which was then exposed to ultraviolet ray under condition of patterned mask attached.

It was washed with solvent to remove unhardened portion so as to form finely patterned lower electrode and thermally treat it.

Piezoelectric/electrostrictive ceramic complex substance manufactured by mixing piezoelectric/electrostrictive fine powder of PZT-PMN series below 0.5 μm in particle diameter prepared by nonexplosive oxidative/reductive combustion, reaction, ultraviolet ray hardening bond and binder in weight ratio 7:2:1 was coated on whole surface of lower electrode.

Whence α-terpineol solution of ethyl cellulose was used for the binder.

Finely patterned stainless steel mask was attached on it and ultraviolet ray was irradiated to harden the exposed portion, after which the unhardened portion was washed by solvent to produce finely patterned piezoelectric/electrostrictive layer.

Silver paste was coated by screen printing on whole surface of dried piezoelectric/electrostrictive layer, mask was attached on it, and it was exposed to ultraviolet ray. Unhardened portion was removed by washing with solvent. So ceramic device was produced by drying.

EXAMPLE 6

Screen printing of ultraviolet ray hardening silver bond was carried out on silicon substrate, which was then exposed to ultraviolet ray under condition of patterned mask attached.

It was washed with solvent to remove unhardened portion so as to form finely patterned lower electrode and thermally treat it.

Piezoelectric/electrostrictive ceramic complex substance manufactured by mixing piezoelectric/electrostrictive fine powder of PZT-PMN series below 0.5 μm in particle diameter prepared by nonexplosive oxidative/reductive combustion reaction, ultraviolet ray hardening bond and binder in weight ratio 7:2:1 was coated on whole surface of the lower electrode.

Whence polyethylene glycol added of a small amount of dibutyl phthalate was used for the binder.

Finely patterned stainless steel mask was attached on it and ultraviolet ray was irradiated to harden the exposed portion, after which the unhardened portion was washed by solvent to produce finely patterned piezoelectric/electrostrictive layer.

Silver paste was coated by screen printing on whole surface of dried piezoelectric/electrostrictive layer, mask was attached on it, and it was exposed to ultraviolet ray. Unhardened portion was removed by washing with solvent. So ceramic device was produced by drying.

Ceramic device manufactured as above was thermally treated 800° C. to burn off organic compounds contained in the piezoelectric/electrostrictive layer and the upper electrode.

EXAMPLE 7

Platinum paste was finely patterned by screen printing on silicon substrate and was sintered to form a lower electrode.

Piezoelectric/electrostrictive ceramic complex substance manufactured by mixing ultraviolet ray hardening bond and piezoelectric/electrostrictive fine powder of PZT-PMN series below 0.5 μm in particle diameter prepared by nonexplosive oxidative/reductive combustion reaction in weight ratio 2:8 was coated on whole surface of the lower electrode.

Finely patterned stainless steel mask was attached on it and ultraviolet ray was irradiated to harden the exposed portion, after which the unhardened portion was washed by solvent to produce finely patterned piezoelectric/electrostrictive layer.

Silver paste was coated by screen printing on whole surface of dried piezoelectric/electrostrictive layer, mask was attached on it, and it was exposed to ultraviolet ray.

Unhardened portion was removed by washing with solvent. So ceramic device was produced by drying.

EXAMPLE 8

Platinum paste was finely patterned by screen printing on silicon substrate and was sintered to form a lower electrode.

Piezoelectric/electrostrictive ceramic complex substance manufactured by mixing ultraviolet ray hardening bond and piezoelectric/electrostrictive fine powder of PZT-PMN series below 0.5 μm in particle diameter prepared by nonexplosive oxidative/reductive combustion reaction in weight ratio 2:8 was coated on whole surface of the lower electrode.

Finely patterned stainless steel mask was attached on it and ultraviolet ray was irradiated to harden the exposed portion, after which the unhardened portion was washed by solvent to produce finely patterned piezoelectric/electrostrictive layer.

Silver paste was coated by screen printing on whole surface of dried piezoelectric/electrostrictive layer, mask was attached on it, and it was exposed to ultraviolet ray. Unhardened portion was removed by washing with solvent. So ceramic device was produced by drying.

Ceramic device manufactured as above was thermally treated 800° C. to burn off organic compounds contained in the piezoelectric/electrostrictive layer and the upper electrode.

EXAMPLE 9

A lower electrode was formed by screen printing of silver paste on silicon substrate and thermally treated it.

Piezoelectric/electrostrictive ceramic complex substance manufactured by mixing ultraviolet ray hardening bond and piezoelectric/electrostrictive fine powder of PZT-PMN series below 0.5 μm in particle diameter prepared by non-explosive oxidative/reductive combustion reaction in weight ratio 2:8 was coated on whole surface of nickel substrate.

Finely patterned stainless steel mask was attached on it and ultraviolet ray was irradiated to harden the exposed portion, after which the unhardened portion was washed by solvent to form finely patterned piezoelectric/electrostrictive layer which was then dried.

Vapor deposition mask was attached on the dired piezoelectric/electrostrictive layer and vacuum vapor deposition of aluminum was performed to form an upper electrode to produce a ceramic device.

EXAMPLE 10

A lower electrode was formed by screen printing of silver paste on silicon substrate and then by thermally treating it.

A piezoelectric/electrostrictive ceramic complex substance manufactured by mixing ultraviolet ray hardening bond and piezoelectric/electrostrictive fine powder of PZT-PMN series below 0.5 μm in particle diameter prepared by nonexplosive oxidative/reductive combustion reaction in weight ratio 2:8 was coated on whole surface of nickel substrate.

Finely patterned stainless steel mask was attached on it and ultraviolet ray was irradiated to harden the exposed portion, after which the unhardened portion was washed by solvent to form finely patterned piezoelectric/electrostrictive layer which was then dried.

Vapor deposition mask was attached on this dired piezoelectric/electrostrictive layer and vacuum vapor deposition of aluminum was performed to form an upper electrode to produce a ceramic device.

Ceramic device manufactured as above was thermally treated 800° C. to burn off organic compounds contained in the piezoelectric/electrostrictive layer and the upper electrode.

EXAMPLE 11

On stainless steel substrate piezoelectric/electrostrictive fine powder below 0.1 μm in particle diameter prepared by nonexplosive oxidative/reductive combustion reaction, glycolic PZT sol and ultraviolet ray hardening resin were mixed in weight ratio 7:1:2 whose mixture was coated by screen printing on whole surface of lower electrode and was dried.

Ultraviolet ray hardening silver bond was coated by screen printing on whole surface of dried piezoelectric/electrostrictive ceramic complex substance layer and was dried.

Finely patterned stainless steel mask was attached on it and ultraviolet ray was irradiated to harden the exposed portion, after which the unhardened portion was washed by solvent to produce finely patterned ceramic device.

EXAMPLE 12

On stainless steel substrate piezoelectric/electrostrictive fine powder below 0.1 μm in particle diameter prepared by nonexplosive oxidative/reductive combustion reaction, glycolic PZT sol and ultraviolet ray hardening resin were mixed in weight ratio 7:1:2 whose mixture was coated by screen printing on whole surface of lower electrode and was dried.

Ultraviolet ray hardening silver bond was coated by screen printing on whole surface of dried piezoelectric/electrostrictive ceramic complex substance layer and was dried.

Finely patterned stainless steel mask was attached on it and ultraviolet ray was irradiated to harden the exposed portion, after which the unhardened portion was washed by solvent to produce finely patterned ceramic device.

Ceramic device manufactured as above was thermally treated 500° C. to burn off organic compounds contained in piezoelectric/electrostrictive layer and upper electrode.

EXAMPLE 13

Piezoelectric/electrostrictive ceramic complex substance manufactured by mixing ultraviolet ray hardening bond and piezoelectric/electrostrictive fine powder of PZT-PMN series below 0.5 μm in particle diameter prepared by non-explosive oxidative/reductive combustion reaction in weight ratio 2:8 was coated on whole surface of nickel substrate.

Finely patterned stainless steel mask was attached on it and ultraviolet ray was irradiated to harden the exposed portion, after which the unhardened portion was washed by solvent to form finely patterned piezoelectric/electrostrictive layer which was then dried.

Ultraviolet ray hardening silver bond was coated by screen printing on whole surface of dried piezoelectric/electrostrictive layer, mask was attached on it, and it was exposed to ultraviolet ray. Unhardened portion was removed by washing with solvent to produce finely patterned ceramic device.

EXAMPLE 14

Piezoelectric/electrostrictive ceramic complex substance manufactured by mixing ultraviolet ray hardening bond and piezoelectric/electrostrictive fine powder of PZT-PMN series below 0.5 μm in particle diameter prepared by non-explosive oxidative/reductive combustion reaction in weight ratio 2:8 was coated on whole surface of nickel substrate.

Finely patterned stainless steel mask was attached on it and ultraviolet ray was irradiated to harden the exposed portion, after which the unhardened portion was washed by solvent to form finely patterned piezoelectric/electrostrictive layer which was then dried.

Ultraviolet ray hardening silver bond was coated by screen printing on whole surface of dried piezoelectric/electrostrictive layer, mask was attached on it, and it was exposed to ultraviolet ray. Unhardened portion was removed by washing with solvent to produce finely patterned ceramic device.

Ceramic device manufactured as above was thermally treated 500° C. to burn off organic compounds contained in piezoelectric/electrostrictive layer and upper electrode.

What is claimed is:

1. A method for manufacturing a ceramic device using a mixture with photosensitive resin comprising the steps of:
    providing a ceramic substrate;
    forming a lower electrode on said substrate using a mixture of photosensitive resin and metal;
    masking and exposing said lower electrode to pattern said lower electrode;
    forming a piezoelectric/electrostrictive layer on said lower electrode using a mixture of photosensitive resin and piezoelectric/electrostrictive ceramic;
    masking and exposing said piezoelectric/electrostrictive layer to pattern said piezoelectric/electrostrictive layer;
    forming an upper electrode on said piezoelectric/electrostrictive layer using the mixture of photosensitive resin and metal; and
    exposing said upper electrode to pattern said upper electrode.

2. The method in claim 1, further comprising the step of thermally treating the ceramic device at 500–1200° C.

3. The method in claim 1, wherein said ceramic is selected from the group consisting of aluminum oxide, zirconium oxide, silicon, silicon carbide, silicon nitride, silicon dioxide and glass.

4. The method in claim 1, wherein said mixture of photosensitive resin and piezoelectric/electrostrictive ceramic is one of a ceramic sol solution containing a photosensitive complexing agent, a mixture of ultraviolet ray hardening resin and ceramic powder, a mixture of said mixture of ultraviolet ray hardening resin and ceramic powder, or a mixture prepared by additional mixing of an organic solvent for controlling a material property into said mixture of ultraviolet ray hardening resin and ceramic powder.

5. The method of claim 1, wherein said photosensitive resin to form the mixture with the metal is a conductive UV adhesive or a transformed material of organic compound making a chelate with said metal.

* * * * *